US009849850B2

(12) United States Patent
Iwai

(10) Patent No.: US 9,849,850 B2
(45) Date of Patent: Dec. 26, 2017

(54) SYSTEM FOR MONITORING BATTERY PROVIDED IN VEHICLE

(71) Applicant: HONDA ACCESS CORP., Niiza-shi, Saitama (JP)

(72) Inventor: Shiro Iwai, Niiza (JP)

(73) Assignee: HONDA ACCESS CORP., Niiza-shi (JP)

( * ) Notice: Subject to any disclaimer, the term of this patent is extended or adjusted under 35 U.S.C. 154(b) by 367 days.

(21) Appl. No.: 14/424,800

(22) PCT Filed: Aug. 28, 2013

(86) PCT No.: PCT/JP2013/072981
§ 371 (c)(1),
(2) Date: May 15, 2015

(87) PCT Pub. No.: WO2014/034710
PCT Pub. Date: Mar. 6, 2014

(65) Prior Publication Data
US 2015/0298630 A1 Oct. 22, 2015

(30) Foreign Application Priority Data

Aug. 29, 2012 (JP) .................................. 2012-188962
Aug. 29, 2012 (JP) .................................. 2012-189005
Aug. 29, 2012 (JP) .................................. 2012-189050

(51) Int. Cl.
*H02J 7/00* (2006.01)
*H02J 9/00* (2006.01)
(Continued)

(52) U.S. Cl.
CPC ......... *B60R 16/033* (2013.01); *B60L 11/1811* (2013.01); *B60R 16/04* (2013.01);
(Continued)

(58) Field of Classification Search
CPC ........ H02J 7/00; H02J 7/14; H02J 9/00; H02J 3/32; H02J 3/34; B60R 16/033;
(Continued)

(56) References Cited

U.S. PATENT DOCUMENTS 3,917,017 A * 11/1975 Deane ................... B60L 11/126
180/65.245
5,488,283 A * 1/1996 Dougherty .......... B60L 11/1855
307/10.1
(Continued)

FOREIGN PATENT DOCUMENTS

JP 2001-043408 A 2/2001
JP 2006-67644 A 3/2006
(Continued)

OTHER PUBLICATIONS

Notification of Transmittal of Translation of the International Preliminary Report on Patentability (Form PCT/IB/338) of International Application No. PCT/JP2013/072981 dated Mar. 12, 2015 with Forms PCT/IB/373 and PCT/ISA/237 (English translation) (11 pages).
(Continued)

*Primary Examiner* — Phallaka Kik
(74) *Attorney, Agent, or Firm* — Westerman, Hattori, Daniels & Adrian, LLP

(57) ABSTRACT

A system (e.g., a monitoring device) for monitoring a first battery (e.g., a vehicle battery) provided in a vehicle is provided with a monitoring unit for monitoring the electric state of the first battery (e.g., the vehicle battery) capable of starting a motor of the vehicle; and a power supply unit that is a second battery for supplying electric power to the monitoring unit. The monitoring unit may determine whether or not the motor is stopped, and when the motor is
(Continued)

stopped, the monitoring unit may monitor, as the electric state of the first battery, e.g., the voltage of the first battery.

12 Claims, 8 Drawing Sheets

(51) Int. Cl.

| | | |
|---|---|---|
| H02J 3/32 | (2006.01) | |
| B60R 16/033 | (2006.01) | |
| G01R 31/00 | (2006.01) | |
| G01R 19/00 | (2006.01) | |
| B60L 11/18 | (2006.01) | |
| B60R 16/04 | (2006.01) | |
| B60R 25/30 | (2013.01) | |
| G01R 31/36 | (2006.01) | |
| H02H 3/34 | (2006.01) | |
| H01M 10/46 | (2006.01) | |
| G08B 21/00 | (2006.01) | |
| H01M 10/44 | (2006.01) | |
| G01R 19/165 | (2006.01) | |

(52) U.S. Cl.
CPC .......... *B60R 25/30* (2013.01); *G01R 31/3606* (2013.01); *G01R 31/3644* (2013.01); *G01R 19/16542* (2013.01); *G08B 21/00* (2013.01); *H01M 10/44* (2013.01); *H01M 10/46* (2013.01); *H02H 3/34* (2013.01); *H02J 3/32* (2013.01); *H02J 7/00* (2013.01); *H02J 9/00* (2013.01)

(58) Field of Classification Search
CPC ...... B60R 16/04; B60R 25/30; B60L 11/1811; G01R 31/3606; G01R 31/3644; G01R 19/16542; H01M 10/44; H01M 10/46; G08B 21/00
USPC ....... 320/104, 120, 134, 136, 164; 307/10.2, 307/10.7, 150, 149, 46; 340/455, 636.1
See application file for complete search history.

(56) References Cited

U.S. PATENT DOCUMENTS

| | | | | |
|---|---|---|---|---|
| 5,657,417 A * | 8/1997 | Di Troia | ................... | B25F 5/00 173/148 |
| 6,420,793 B1 * | 7/2002 | Gale | ........................ | F02N 11/04 123/179.28 |
| 6,466,024 B1 * | 10/2002 | Rogers | ................. | B60L 11/1861 324/427 |
| 6,590,396 B1 * | 7/2003 | Zur | ........................ | H02J 7/1461 324/433 |
| RE40,820 E * | 7/2009 | Rogers | ................. | B60L 11/1861 320/104 |
| 8,779,923 B2 * | 7/2014 | Fujiwara | ............. | B60L 11/1846 340/10.1 |
| 8,781,442 B1 * | 7/2014 | Link, II | ................. | G08G 1/205 370/338 |
| 8,812,061 B2 * | 8/2014 | Springs | ................. | B60R 25/403 340/438 |
| 8,860,348 B2 * | 10/2014 | Savagian | ................. | B60L 7/14 318/111 |
| 9,694,697 B2 * | 7/2017 | Brabec | ................. | B60L 11/1861 |
| 2001/0040441 A1 * | 11/2001 | Ng | ........................ | H02J 7/0032 320/104 |
| 2002/0190873 A1 * | 12/2002 | Flick | ....................... | B60R 25/04 340/988 |
| 2004/0124990 A1 * | 7/2004 | Zur | ..................... | G01R 31/3644 340/636.1 |
| 2005/0067838 A1 * | 3/2005 | Gray, Jr. | ................... | B60K 5/08 290/40 C |
| 2005/0099160 A1 * | 5/2005 | Asaumi | ................. | H02J 7/0019 320/132 |
| 2005/0280393 A1 * | 12/2005 | Feldmann | ............. | H02J 7/0014 320/114 |
| 2006/0017584 A1 * | 1/2006 | Yanagida | ............ | B60R 25/1004 340/652 |
| 2006/0028210 A1 * | 2/2006 | Yanagida | ............ | B60R 25/1004 324/426 |
| 2006/0058897 A1 | 3/2006 | Senda et al. | | |
| 2006/0097577 A1 * | 5/2006 | Kato | .................... | F02N 11/0866 307/10.1 |
| 2007/0145950 A1 * | 6/2007 | Wang | ........................ | H02J 1/14 320/134 |
| 2008/0278345 A1 * | 11/2008 | Van Bosch | ........ | H04B 7/18517 340/870.07 |
| 2009/0001926 A1 * | 1/2009 | Sato | ..................... | B60L 3/0046 320/102 |
| 2009/0108814 A1 * | 4/2009 | Wilkins | ................ | H02J 7/1423 320/162 |
| 2009/0261761 A1 * | 10/2009 | Yoshioka | ................ | B60L 3/003 318/139 |
| 2010/0244782 A1 * | 9/2010 | Nagayama | .......... | B60L 11/1868 320/162 |
| 2011/0025124 A1 * | 2/2011 | Brabec | ................ | B60L 11/1861 307/9.1 |
| 2011/0032092 A1 | 2/2011 | Senno | | |
| 2011/0197844 A1 * | 8/2011 | Matsubara | .............. | B60R 25/00 123/179.2 |
| 2012/0049621 A1 * | 3/2012 | Shinoda | ................. | B60L 3/0092 307/10.1 |
| 2012/0149323 A1 * | 6/2012 | Springs | ................. | B60R 25/403 455/404.1 |
| 2013/0191321 A1 * | 7/2013 | Lovett | ................. | B60L 11/1838 706/58 |
| 2015/0185291 A1 * | 7/2015 | Dao | .................... | G01R 31/3658 324/434 |
| 2017/0232858 A1 * | 8/2017 | Heuer | ................. | B60L 11/1818 |

FOREIGN PATENT DOCUMENTS

| | | |
|---|---|---|
| JP | 2007-276665 A | 10/2007 |
| JP | 2008-064584 A | 3/2008 |
| JP | 2008-279939 A | 11/2008 |
| JP | 2011-37332 A | 2/2011 |
| JP | 2011-227557 A | 11/2011 |
| JP | 2012-25297 A | 2/2012 |

OTHER PUBLICATIONS

International Search Report dated Nov. 12, 2013, issued in corresponding application No. PCT/JP2013/072981.

* cited by examiner

| VEHICLE BATTERY RESIDUCAL CAPACITY (%) | VOLTAGE (V) | NOTE |
|---|---|---|
| 100 | 12.5 | — |
| 90 | 12.2 | — |
| 83 | 12.0 | — |
| 75 | 11.5 | BATTERY DETERIORATION |
| 60 | 11.0 | ENGINE DISABLED |

FIG.6

| ELECTRIC COMPONENT (LIGHT) | OUTPUT (W) |
|---|---|
| HEADLIGHT | 110 |
| HAZARD LAMP | 30 |
| SMALL LIGHT | 20 |
| MAP LAMP | 5 |
| DOOR COURTECY LAMP | 5 |

SYSTEM FOR MONITORING BATTERY PROVIDED IN VEHICLE

TECHNICAL FIELD

The present invention relates to a system (vehicle battery monitoring system) for monitoring a battery (vehicle battery) provided in a vehicle.

BACKGROUND ART

Vehicles such as automobiles are provided with electric components such as headlights, car security devices, etc. The electric components are supplied with electric power from a vehicle battery for operation. For example, Patent Document 1 shows in the drawings a car security device. According to the description of Patent Document 1, the car security device is normally supplied with electric power from a main power supply (vehicle battery). When the electric power from the main power supply is not supplied to the car security device, the car security device is supplied with electric power from a chargeable battery (standby battery) via a power switching unit.

The vehicle battery can start a motor of the vehicle and hence is an important part or component. However, since the vehicle battery is also able to supply electric power to various electric components as described above, the residual capacity of the vehicle battery decreases depending on the operating state (using state) of each individual electric component. When the residual capacity of the vehicle battery is low, the motor of the vehicle is not started. In other words, the vehicle battery may become dead according to the operating state (using state) of the electric components.

Patent Document 1 also describes that vibration is detected by a sensor. However, when determining whether the vehicle has been stolen or not based on the presence/absence of vibration, if vibration is produced, for example, by a cat jumped on an engine, it may occur that a theft of the vehicle is erroneously determined even when the situation is not a vehicle theft actually. Such erroneous determination of the vehicle theft made especially at night will bother neighborhood due to alarm noise.

PRIOR ART LITERATURE

Patent Documents

[Patent Document 1] Japanese Patent Application Laid-Open Publication (JP-A) No. 2008-279939

SUMMARY OF INVENTION

An object of the present invention is to provide a vehicle battery monitoring system capable of suppressing a reduction in the residual capacity of a vehicle battery. Other objects of the invention will become apparent to those skilled in the art when making reference to the following description of preferred embodiments and the accompanying sheets of drawings.

To facilitate easy understanding of the summary of the invention, examples of preferred forms of the invention will be described.

In one or a first preferred form of the invention, there is provided a system (vehicle battery monitoring system) for monitoring a first battery (vehicle battery) provided in a vehicle comprises: a monitoring unit for monitoring an electric state of the first battery capable of starting a motor of the vehicle; and a power supply unit that is a second battery for supplying electric power to the monitoring unit.

With this arrangement, the monitoring unit can monitor the electric state of the first battery which is capable of starting the motor of the vehicle. The electric state of the first battery deteriorates with a reduction in the residual capacity of the first battery. It is therefore possible for the monitoring unit to monitor the residual capacity of the first battery via the electric state of the first battery. In other words, the monitoring unit can monitor whether or not a current residual capacity of the first battery can start up, for example, the motor of the vehicle.

Furthermore, the monitoring unit, which monitors the residual capacity of the first battery, is supplied with the electric power for operation from the second battery, which is different from the first battery capable of starting the motor of the vehicle. The second battery can suppress reduction of the residual capacity of the first battery while the residual capacity of the first battery is monitored by the monitoring unit.

Additionally, the monitoring unit can monitor a voltage, current, etc. of the first battery as the electric state of the first battery which is capable of starting the motor of the vehicle. For instance, when an electric component is illegally used, power of the first battery is consumed. Additionally, when the vehicle is illegally moved without operating the motor, the effect of an AC generator (ACG) is not reflected on the state of the first battery. Thus, when the vehicle is being stolen or after the vehicle is stolen, abnormalities occur in the electric state, such as the voltage, current, etc., of the first battery.

The first preferred form of the invention can be used in second to fourth preferred forms of the invention described later. In other words, the first preferred form of the invention is a basic form for the second to fourth preferred forms.

According to a second preferred form of the invention, there is provided a system (vehicle battery monitoring system) for monitoring a first battery (vehicle battery) provided in a vehicle comprises: a monitoring unit for monitoring an electric state of the first battery capable of starting a motor of the vehicle; and a power supply unit that is a second battery for supplying electric power to the monitoring unit, wherein the monitoring unit determines whether the motor is stopped or not, and when the motor is stopped, the monitoring unit monitors a voltage of the first battery as the electric state of the first battery.

With this arrangement, when the motor is stopped, the monitoring unit can monitor the voltage of the first battery which is capable of starting the motor of the vehicle. The voltage of the first battery drops with a reduction in the residual capacity of the first battery and, hence, the monitoring unit can monitor the residual capacity of the first battery via the voltage of the first battery.

In the second preferred form of the invention, the monitoring unit may forecast a time at which the voltage of the first battery is less than a first voltage.

By thus forecasting the time when the voltage of the first battery is less than the first voltage, the monitoring unit can allow a voltage drop of the first battery until that time.

In the second preferred form of the invention, the system may further comprise a switching unit capable of connecting the first battery and the second battery in parallel, wherein when the motor is stopped, the monitoring unit controls the switching unit such that the first battery and the second battery are connected in parallel, and the second battery supplies the electric power therefrom to an electric component to which electric power from the first battery has been supplied.

With the electric power supplied from the second battery to the electric component, the second battery can suppress a reduction in the residual capacity of the first battery.

In the second preferred form of the invention, the monitoring unit may control the switching unit such that the first battery and the second battery are disconnected during a time period ranging from a time at which the motor is stopped to a time at which the voltage of the first battery is less than a second voltage higher than the first voltage.

During the time period starting when the motor is stopped and ended at the time the voltage of the first battery is less than the second voltage, in other words, when the residual capacity of the first battery is large, the switching unit is allowed to continue supply of the electric power from the first battery to the electric component.

In the second preferred form of the invention, the system may further comprise an informing unit for informing a user of a monitoring result of the monitoring unit.

With this arrangement, since the informing unit can inform the user of a residual capacity of the first battery, the user is allowed to recover the residual capacity of the first battery before the residual capacity of the first battery becomes small. As an alternative, the user may continue to use the first battery without taking care of the residual capacity of the first battery until the residual capacity of the first battery becomes small.

In the second preferred form of the invention, the system may further comprise a vibration sensor for detecting vibration of the motor, wherein with the use of the vibration sensor, the monitoring unit determines whether the motor is stopped or not.

With this arrangement, the monitoring unit can determine whether the motor is stopped or not, by means of the vibration sensor in place of an ignition switch.

According to a third preferred form of the invention, there is provided a system (vehicle battery monitoring system) for monitoring a first battery (vehicle battery) provided in a vehicle comprises: a monitoring unit for monitoring an electric state of the first battery capable of starting a motor of the vehicle; a power supply unit that is a second battery for supplying electric power to the monitoring unit, and a switching unit capable of connecting the first battery and the second battery in parallel, wherein the monitoring unit monitors a voltage of the first battery as the electric state, and wherein the monitoring unit, on the basis of a monitoring result, controls the switching unit such that the first battery and the second battery are connected in parallel, and the second battery supplies the electric power therefrom to the first battery.

With this arrangement, the monitoring unit can monitor the residual capacity of the first battery via the voltage of the first battery. In other words, the monitoring unit can determine whether the first battery becomes weak based on a current residual capacity of the first battery. The monitoring unit, which monitors the residual capacity of the first battery, controls the switching unit on the basis of a monitoring result such that the electric power from the second battery is supplied to the first battery. During that time, the second battery can suppress reduction of the residual capacity of the first battery.

In the third preferred form of the invention, the monitoring unit may monitor a discharge current from the second battery.

The monitoring unit monitors the discharge current from the second battery. When the electric power from the second battery is supplied to the first battery, the discharge current from the second battery corresponds to, for example, a dark current of the electric component while the motor is off. As an alternative, the discharge current from the second battery is correlated with, for example, a degradation of the first battery when the motor is operating. When the discharge current from the second battery is large, the monitoring unit may perform control in such a manner as to suppress a reduction in the residual capacity of the second battery.

In the third preferred form of the invention, when the discharge current is less than a predetermined value, the monitoring unit may control the switching unit such the first battery and the second battery are connected in parallel, and the second battery supplies the electric power therefrom to the first battery.

With this arrangement, when the discharge current from the second battery is small, the first battery is allowed to continue the supply of electric power therefrom to the first battery.

In the third preferred form of the invention, when the discharge voltage is less than a predetermined voltage and the motor is stopped, the monitoring unit controls the switching unit such that the first battery and the second battery are connected in parallel, and the second battery supplies the electric power therefrom to the first battery.

With this arrangement, when a dark current of the electric component, which corresponds to the discharge current from the second battery, is small, the second battery is allowed to continue the supply of electric power therefrom to the first battery. Furthermore, when the dark current of the electric component is small, the electric power from the second battery may be supplied to the first battery via a thin electric wire, which will increase the degree of freedom in arranging the monitoring unit.

In the third preferred form of the invention, when the motor is in operation, the monitoring unit charges the second battery.

The monitoring unit can thus compensate for electric power which has been supplied from the second battery to the first battery.

In the third preferred form of the invention, the system may further comprise an informing unit for informing a user of a monitoring result of the monitoring unit.

With this arrangement, since the informing unit can inform the user of a residual capacity of the first battery, the user is allowed to recover the residual capacity of the first battery before the residual capacity of the first battery becomes small. As an alternative, the user may continue to use the first battery without taking care of the residual capacity of the first battery until the residual capacity of the first battery becomes small.

According to a fourth preferred form of the invention, there is provided a for monitoring a first battery provided in a vehicle, comprising: a monitoring unit for monitoring an electric state of the first battery capable of starting a motor of the vehicle; and a power supply unit that is a second battery for supplying electric power to the monitoring unit, wherein the monitoring unit, on the basis of a monitoring result, determines whether the vehicle is stolen or not.

With this arrangement, the monitoring unit can monitor the electric state, such as a voltage, current, etc., of the first battery which is capable of starting the motor of the vehicle. For instance, when the electric component is illegally used, electric power of the first battery is consumed. As an alternative, when the vehicle is illegally moved without operating the motor, the effect of the ACG is not reflected on the state of the first battery. Thus, when the vehicle is being stolen or after the vehicle is stolen, abnormalities occur in the electric state, such as the voltage, current, etc., of the first battery.

Thus, the monitoring unit can determine whether the vehicle has been stolen or not based on a monitoring result (i.e., a voltage of the first battery or a current of the first battery). In other words, when the voltage of the first battery and/or the current of the first battery represents a predetermined pattern, the monitoring unit can determine that the vehicle has been stolen.

In the fourth preferred form of the invention, when the motor is stopped, the monitoring unit monitors whether a voltage drop rate, as the electric state, of the first battery is larger than a predetermined drop rate or not, and/or whether a current consumption rate, as the electric state, of the first battery is larger than a predetermined consumption rate.

When stealing the vehicle, a theft may illegally enter a vehicle cabin and illegally start the motor. Since the theft does not have a key of the vehicle, illegal startup of the motor without the key needs a certain period of time. When the theft tries to steal an electric component (part of the vehicle) such as an audio device, it will take a certain time to remove the electric component. In this instance, illegal intrusion of the theft into the vehicle cabin is accompanied with lighting of a room lamp for a relatively long time. Under such condition, the voltage drop rate of the first battery and/or the current consumption rate of the first battery becomes large. The monitoring unit can monitor the presence/absence of a vehicle theft on the basis of the voltage drop rate of the first battery and/or the current consumption rate of the first battery.

In the fourth preferred form of the invention, when the vehicle is moving, the monitoring unit may monitor whether a variation width of the voltage, as the electric state, of the first battery during a prescribed period is smaller than a predetermined variation width or not, and/or whether a charge amount of the current, as the electric state, of the first battery during a prescribed period is smaller than a predetermined charge amount.

When stealing a vehicle, the theft may pull or tow the vehicle by a wrecker truck without starting the motor. In this instance, because the motor is not operating, the ACG does not generate electric power. Under such condition, the voltage variation width of the first battery and/or the current charge amount of the first battery is not increased. The monitoring unit can monitor the presence/absence of a vehicle theft via the voltage variation width of the first battery and/or the current charge amount of the first battery.

In the fourth preferred form of the invention, when the vehicle is stolen, the monitoring unit may cause the first battery to be discharged.

When discharged, the voltage of the first battery or the residual capacity of the first battery reduces. Under such condition, the first battery does not have enough power or capacity required for starting the motor. By thus placing the motor in a start-up-disabled state, a theft of the vehicle itself can be prevented.

In the fourth preferred form of the invention, the system may further comprise a shut-off unit for shutting off electric power supplied from the first battery to an electric component.

When the electric power supplied to the electric component is shut off, it is no longer possible to start up the motor. By thus keeping the motor in a start-up-disabled state, a theft of the vehicle itself can be prevented.

In the fourth preferred form of the invention, the system may further comprise an informing unit for informing a user of a monitoring result of the monitoring unit.

Since the monitoring unit can inform the user of the monitoring result (the voltage of the first battery and/or the current of the first battery), the user is allowed to personally confirm whether the monitoring result represents a vehicle theft or not. In other words, the monitoring unit may erroneously determine a vehicle theft, and when it is evident that vehicle is not stolen, the user can cancel the erroneous determination. Alternatively, when it is evident that the vehicle is stolen, the user can fix the vehicle theft.

A person skilled in the art will readily understood that further modifications of the foregoing preferred forms of the invention are possible without departing from the spirit of the present invention.

BRIEF DESCRIPTION OF DRAWINGS

FIG. 6 is a table showing the relationship between electric components and their outputs;

DESCRIPTION OF EMBODIMENTS

Preferred embodiments described below are used for easy understanding of the present invention. A person skilled in the art shall note that the invention should by no means be restricted to the below described preferred embodiments.

(First Embodiment)

Figure 1:
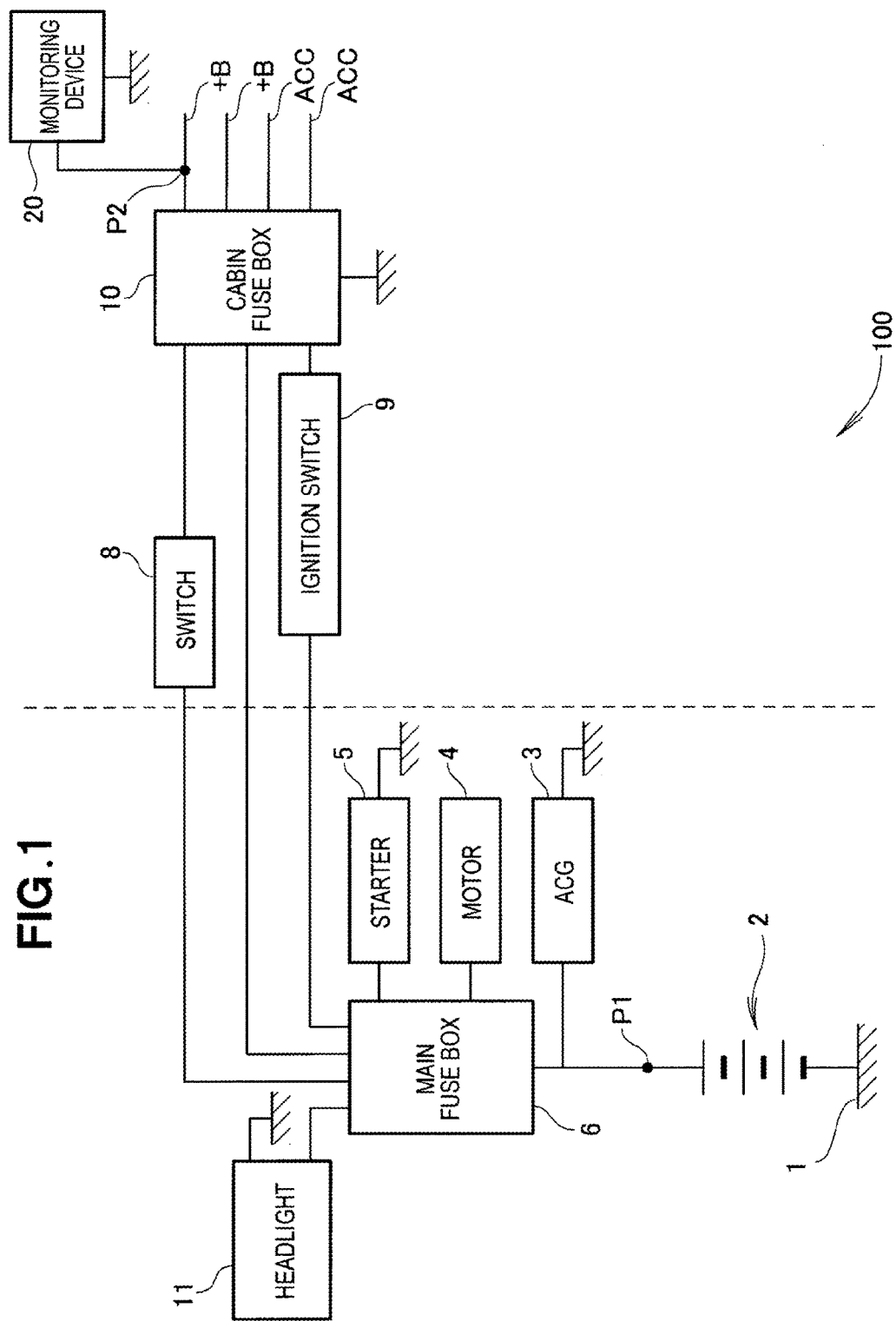
FIG. 1 is a block diagram showing a first example of configuration of a vehicle battery monitoring system according to the present invention.

FIG. 1 shows an example of configuration of a vehicle battery monitoring system according to the present invention. In the example shown in FIG. 1, the vehicle battery monitoring system monitors a first battery (vehicle battery) 2 provided in a vehicle 100 and includes a monitoring device 20, for example. In other words, the vehicle battery monitoring system includes, at least, the monitoring device 20 and may include the first battery 2, for example. Additionally, the vehicle battery monitoring system may further include electric components such as a headlight 11, etc.

In the example shown in FIG. 1, the monitoring device 20 is arranged at node P2 on a regular power supply line +B. However, the monitoring device 20 may be arranged at an arbitrary node on the regular power supply line +B, such as node P1 located near the base of a positive terminal of the first battery 2. As will be described later, the monitoring device 20 or the vehicle battery monitoring system monitors an electric state on the regular power supply line +B, i.e., an electric state of the first battery 2.

In the example of FIG. 1, the vehicle 100 is an automobile, for example. The automobile includes an engine room or compartment accommodating therewithin a motor 4 comprised of an internal combustion engine such as a gasoline engine, and a cabin accommodating therewithin a driver's seat, for example. The first battery 2 is disposed in the engine compartment, and a negative terminal of the first battery 2 is grounded to a vehicle body 1. The positive terminal of the first battery 2 forms a start point of the regular power supply line +B and is connected or wired to a main fuse box 6 via the node P1 on the regular power supply line +B. The regular power supply line +B is branched before the main fuse box 6 and connected to, for example, an alternating current generator (ACG) 3. The ACG 3 generates an alternating current in response to operation or rotation of the motor 4 and is able to charge the first battery with a direct current converted from the thus generated alternating current.

The main fuse box 6 includes a main fuse (not shown) connected to the node P1 on the regular power supply line +B. The regular power supply line +B is branched within the main fuse box 6 and, a plurality of branched regular power supply lines +B is connected via a plurality of sub-fuses (not shown), respectively, to the electric components such as the headlight 11, a starter 5, etc. The main fuse box 6 includes relays (not shown) which connect or disconnect the regular power supply line +B and respective electric components via the sub-fuses such that the headlight 11 is turned on when a switch 8 is in an ON state, and the headlight 11 is turned off when the switch 8 is in an OFF state. The regular power supply line +B from the main fuse box 6 is connected directly to a cabin fuse box 10 disposed in the cabin of the vehicle 100.

The cabin fuse box 10 includes a plurality of fuses (not shown). The regular power supply line +B is branched into a plurality of regular power supply lines +B within the cabin fuse box 10, and branched regular power supply lines +B are connected to respective ones of the electric components, such as the monitoring device 20, etc., via corresponding ones of the fuses within the cabin fuse box 10. The regular power supply line +B from the main fuse box 6 is converted by an ignition switch 9 into an accessory power supply line ACC, and the accessory power supply line ACC is branched into a plurality of accessory power supply lines ACC within the cabin fuse box 10. The branched accessory power supply lines ACC are connected via corresponding ones of the fuses within the cabin fuse box 10 to electric components such as an audio device (not shown), etc. The audio device connected to the accessory power supply line operates when the ignition switch 9 is in an ON state or ACC state. Alternatively, when the ignition switch 9 is in an OFF state, the audio device is disabled.

Furthermore, when the ignition switch 9 is in a START state, the starter 5 operates to start up the motor 4. Thereafter, the motor 8 continues operation or rotation as long as the ON state of the ignition switch 9 is maintained. When a residual capacity of the first battery 2 is small, the first battery 2 is unable to start the motor 4 of the vehicle 100 via the starter 5. In other words, while the motor 4 is stopped and the ACG 3 does not generate electric power, continuing lighting of the headlight 11 would cause the first battery to become dead or run-out.

Figures 2, 3:
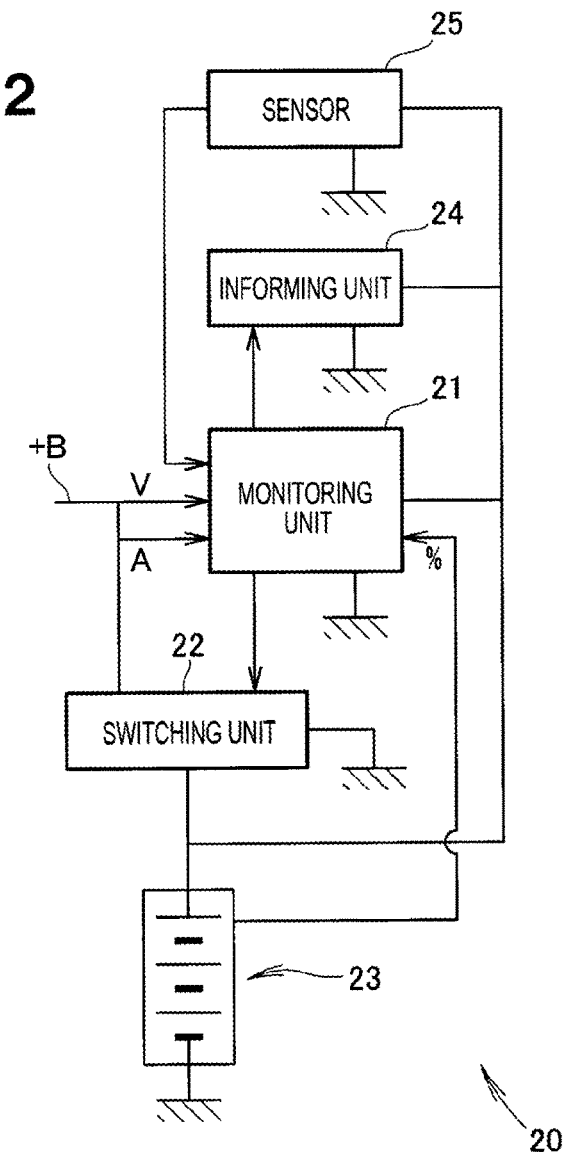
FIG. 2 is a functional block diagram of a monitoring device according to the first example of the present invention.
FIG. 3 is a table showing the relationship between the voltage and the residual capacity of a vehicle battery.

FIG. 2 shows an example of a functional block diagram of the monitoring device 20 according to the present invention. In FIG. 2, the monitoring device 20 constituting the vehicle battery monitoring system includes a monitoring unit 21 that monitors the electric state on the regular power supply line +B, i.e., the electric state of the first battery 2. The monitoring device 20 or the vehicle battery monitoring system includes not only the monitoring unit 21 but also a power supply unit. The power supply unit is not the first battery (vehicle battery) 2 shown in FIG. 1 but is a second battery (standby battery) 23 shown in FIG. 2. The power supply unit constituted by the second battery 23 can supply electric power to the monitoring unit 21. While the monitoring unit 21 monitors the electric state of the first battery 2, the second battery 23 is able to suppress a reduction in the residual capacity of the first battery 2.

The monitoring unit 21 monitors a voltage V of the first battery 1 (at, for example, the node P2 on the regular power supply line +B) as the electric state of the first battery 2. While the motor 4 is stopped, the voltage or the residual capacity of the first battery 2 is reduced by dark currents of electric components, such as a receiver (not shown) of a keyless entry system, an electronic control unit (not shown) for controlling the motor 4, etc. The monitoring unit 21 is able to monitor whether a current voltage or a current residual capacity of the first battery 2 can start up the motor 4 or not. In this instance, the monitoring unit 21 can grasp an accurate residual capacity of the first battery 2 by using the voltage of the first battery 2 which is stable after the motor 2 is stopped.

The monitoring device 20 or the vehicle battery monitoring system may further include a switching unit 22 which is capable of connecting the first battery 2 and the second battery 23 in parallel, an informing unit 21 for informing a user of a monitoring result of the monitoring unit 21, and a vibration sensor 25 for detecting vibration of the motor 4. Operations of the switching unit 22, the informing unit 24 and the vibration sensor 25 will be described later. The power supply unit constituted by the second battery 23 can supply electric power to the switching unit 22, the informing unit 24 and the vibration sensor 25. While the switching unit 22, the informing unit 24 and the vibration sensor 25 are operating, the second battery 23 can suppress reduction of the residual capacity of the first battery 2.

FIG. 3 is a table showing the relationship between the residual capacity of the vehicle battery and the voltage of the vehicle battery. In the table shown in FIG. 1, the vehicle battery is a lead battery, for example. When the residual capacity (initial capacity) of the vehicle battery is 100%, the voltage of the vehicle battery is 12.5V. The vehicle battery voltage drops with a reduction in the vehicle battery residual capacity. For instance, when the residual capacity of the vehicle battery takes values of 90%, 83%, 75% and 60%, the voltage of the vehicle battery takes values of 12.2V, 12.0V, 11.5V and 11.0V, respectively. When the residual capacity of the vehicle battery is less than 75%, for example, the deterioration of the vehicle battery becomes large and the capacity (full charge capacity) of the vehicle battery is reduced. Furthermore, when the residual capacity of the vehicle batter is less than 60%, the engine cannot be started up. Taking such characteristics of the vehicle battery into consideration, it is preferable that the residual capacity or the voltage of the vehicle battery does not decrease or drop. Especially, it is desirable that the residual capacity of the vehicle battery is not less 60% or the voltage of the vehicle battery is less than 11.0V.

In the example shown in FIG. 1, a wiring between the positive terminal of the first battery (vehicle battery) 2 and the node P1 on the regular power supply line +B is formed solely by a thick and short electric wire (of e.g., 5-mm$^2$-diameter) and, hence, an electric resistance of the wiring is almost negligible. On the other hand, because a wiring between the node P1 and the node P2 on the regular power supply line +B is formed by thin and long electric wires (of e.g., 0.5-mm$^2$-diameter) extending not only inside the main fuse box 6 and the cabin fuse box 10 but also between the main fuse box 6 and the cabin fuse box 10, an electric resistance of the wiring is not negligible. In other words, when the voltage V of the first battery 2 is measured at the node P2 on the regular power supply line +B, a measured value of the voltage involves a voltage drop and, hence, a residual capacity of the vehicle battery can be calculated by collecting or compensating an amount of the voltage drop. Additionally, resisting properties, such as heat-resisting property, water-resisting property, etc., of the monitoring device 20 disposed on a cabin side, for example, at the node P1 on the regular power supply line +B are allowed to be set lower than those properties required when the monitoring device 20 is disposed on an engine-compartment side, for example, at the node P1. The monitoring device 20 disposed on the cabin side can be produced at a reduced cost.

Figure 4:
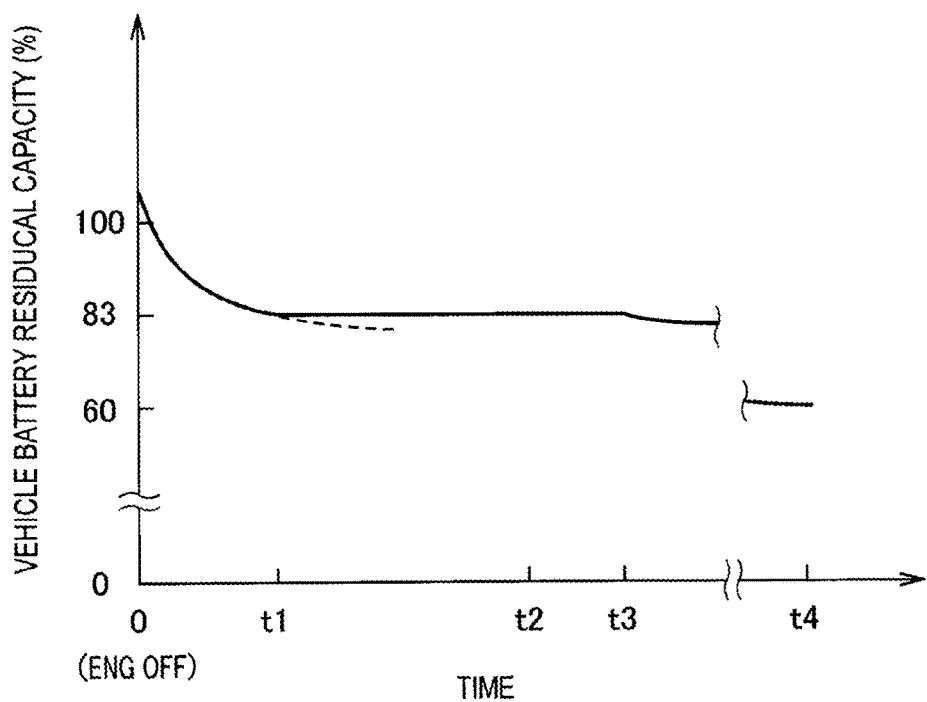
FIG. 4 is a graph showing an example of the residual capacity of the vehicle battery which changes with time.

FIG. 4 is a graph showing an example of the residual capacity of the vehicle battery which varies with time. In the example shown in FIG. 4, time 0 represents a time at which the motor 4 is stopped. The residual capacity of the vehicle battery (first battery) 2 at time 0 is more than 100%. This means that due to power generation performed by the ACG 3 before the motor 4 is stopped, the voltage of the first battery 2 measured immediately after the stop of the motor 4 represents a higher value on the effect of the ACG 3. The monitoring unit 21 shown in FIG. 2 stores the table shown in FIG. 3 and a characteristic of the first battery 2 (i.e., the relationship between the residual capacity and the voltage of the vehicle battery) represented by, for example, a numerical expression equivalent to the table of FIG. 3. On the basis of the stored battery characteristic, the monitoring unit 21 is able to convert a measured voltage V of the first battery 2 into a corresponding residual capacity of the first battery 2. While the motor 4 is off, and more specifically during a time period from time 0 to time t4, the monitoring unit 21 continuously monitors the voltage V of the first battery 2.

After the motor 4 is stopped, the voltage of the first battery 2 gradually decreases by the effect of dark currents of the electric components. It is therefore important to monitor whether a currently measured voltage V of the first battery 2 is large enough to start up the motor 4 or not. It is also important to monitor whether the currently measured voltage V of the first battery 2 leads to great deterioration of the first battery 2 or not. It is therefore important to monitor the voltage V of the first battery 2, that is, the residual capacity of the first battery 2.

In the example shown in FIG. 2, the monitoring unit 21 is able to inform the user of a currently measured voltage V of the first battery 2 or a currently measured residual capacity of the first battery 2, as a monitoring result, via the informing unit 24. The informing unit 24 may comprise, for example, a display, a speaker, etc., which can inform the user (driver) inside the cabin of the monitoring result. Preferably, the informing unit 24 is constituted by a transmitter such as a 3G communication module, a long term evolution (LTE) communication module, a wireless fidelity (Wi-Fi) communication module, etc., so that the monitoring result can be transmitted in a proper transport format such as e-mail to the user or a mobile terminal (not shown) inside or outside the cabin. In response to the transmitted monitoring result, the user is allowed to recover the residual capacity of the first battery 2 by, for example, driving the vehicle 100, charging the first battery 2 with a dedicated charging device (not shown), or connecting a booster cable (not shown) to the first battery 2, before the voltage V or the residual capacity of the battery becomes small. Alternatively, the user may use the first battery 2 or the electric components without taking case of the residual capacity of the first battery 2 until the voltage V or the residual capacity of the first battery 2 becomes small.

The monitoring unit 21 is able to determine whether the motor 4 is stopped or not. In the example shown in FIG. 2, the monitoring unit 21 can determine via the vibration sensor 25 whether the motor 4 is stopped or not. The vibration sensor 25 may be formed by, for example, a triaxial acceleration sensor. When the triaxial acceleration sensor does not detect vibration caused due to operation of the motor 4, the monitoring unit 21 can determine that the motor 4 is stopped. The monitoring unit 21 may determine whether the motor 4 is stopped or not on the basis of the ignition switch 9 being in the OFF state. In this case, the ignition switch 9 and the monitoring unit 21 (monitoring device 20) may be wired to ensure that the monitoring unit 21 can take in a signal from the ignition switch 9.

The vibration sensor 25 may be configured so as to detect vibration (low frequency vibration) having only those frequencies which are lower than frequencies of vibration caused by operation of the motor 4. In this instance, on the basis of the detection of only a low frequency vibration, the monitoring unit 21 can monitor whether the vehicle 100 has been stolen or not. In other words, the monitoring device 20 may be a security device in which instance the monitoring device 20 or the monitoring unit 21 as a security device is able to monitor not only the currently measured voltage or residual capacity of the first battery 2, but also the presence/absence of a theft of the vehicle 100 after the motor 4 is stopped.

In the example shown in FIG. 4, the monitoring unit 21 is able to measure or monitor the voltage V or the residual capacity of the first battery 2 and store the measured values at prescribed time intervals, for example, one minute intervals until the effect of the ACG 3 on the first battery 2 is almost eliminated, namely until a thirty minutes time period from time 0 has elapsed. The monitoring unit 21, on the basis of a plurality of stored measured values, is able to determine an attenuation characteristic of the voltage V or the residual capacity of the first battery 2 and forecast or monitor a time at which the voltage V of the first battery 2 is less than a prescribed voltage corresponding to, for example, a 60% residual capacity of the first battery 2. In the case where a voltage drop from the positive terminal of the first battery 2 to the node P2 is 1.5V, a first voltage corresponding to the 60% residual capacity is 9.5V (=11.0V-1.5V).

Furthermore, the monitoring unit 21 is able to inform the user of the forecast time as a monitoring result via the informing unit 24 by way of a notification such as, for example, "the vehicle battery voltage will be less than the first voltage in ○○ hours", "the residual capacity of the vehicle battery will be less than 60% in ○○ hours", or "the engine will not be able to start in ○○ hours". In this instance, the first voltage is set to a reference value (60% residual capacity) indicative of whether the motor 4 can be started up or not. The first voltage may be set to, for example, another reference value (75% residual capacity)

indicative of whether the deterioration of the battery becomes large or not. In the latter case, the monitoring unit 21 may inform the user of a forecast time, as a monitoring result, via the informing unit 24 by way of a notification such as, for example, "the residual capacity of the vehicle battery will be less than 75% in ○○ hours" or "the vehicle battery will be deteriorated in ○○ hours".

Each time the motor 4 is stopped, that is, each time driving of vehicle 100 is finished, the monitoring unit 21 measures and stores the voltage V or the residual capacity of the first battery 2 at, for example, one minute intervals until, for example, a thirty minutes time period from time 0 has elapsed. The monitoring unit 21 is able to determine a comparative value, such as a mean value, center value, etc., of the past attenuation characteristic of the voltage V or the residual capacity of the first battery 2 so that the monitoring unit 21 can compare or monitor a current attenuation characteristic and the comparative value indicative of the past attenuation characteristic during a time period of thirty minutes from time 0. When the current attenuation characteristic is larger than the past attenuation characteristic and the decreasing speed of the current voltage V or the current residual capacity of the first battery 2 is high, the monitoring unit 21 forecasts or monitors switching-off oversight of an electric component such as the headlight 11, etc., and informs the user of a monitoring result via the informing unit 24 by way of a notification such as, for example, "the headlight is still lighting, please return to the vehicle", or "do you forget to turn off any electric component?"

The monitoring unit 21 is able to determine or monitor whether a current voltage V of the first battery 2 is less than a second voltage or not. In the example shown in FIG. 4, the voltage V of the first battery 2 at time t1 is less than the second voltage which corresponds to, for example, a residual capacity of 83%. The second voltage may be set higher than the first voltage. The monitoring unit 21 is able to defer a future voltage V of the first battery 2 from reaching the first voltage after time t1. When the first voltage is set to a reference (60% residual capacity) indicative of whether it can start the motor 4, the second voltage may be set to the reference (75% residual capacity) indicative of whether the deterioration of the first battery 2 becomes large, instead of the 83% residual capacity.

In the example of FIG. 4, for a time period from time 0 to time t1, the monitoring unit 21 controls the switching unit 22 such that the first battery 2 and the second battery 23 are disconnected. After time t1, the monitoring unit 21 can control the switching unit 22 such that the first battery 2 and the second battery 23 are connected in parallel. After time t1, the second battery 23 can supply electric power to the electric components to which electric power from the first battery 2 has been supplied. Thus, the second battery 23 is able to suppress reduction of the residual capacity of the first battery 2.

A voltage between a positive terminal and a negative terminal of the second battery 23 can be set to 12.8V which is higher than 12.5V corresponding to a 100% residual capacity of the first battery 2. The second battery 23 may be, for example, a lithium-ion storage battery. The second battery 23 is formed by a rapidly chargeable battery, which the residual capacity of the second battery 23 (with initial capacity of 2000 mAh, for example) can be charged from 0% to 100% by charging with a charge current of 2 A for e.g. one hour. The voltage of the second battery 23 constituted by the rapidly chargeable battery can be maintained at e.g. 12.8V regardless of the residual capacity of the second battery 23.

In the example of FIG. 4, for a time period from time t1 to time t3, the electric power from the second battery 23 is supplied to the electric components. The voltage of the first battery 2 is therefore kept at a constant value, i.e., at the second voltage corresponding to the 83% residual capacity of the first battery 2, as indicated by the solid line shown in FIG. 4. If the first battery 2 and the second battery 23 are not connected in parallel at time t1, the voltage V or the residual capacity of the first battery 2 will decrease after time t1 due to dark currents of the electric components.

As previously discussed, the monitoring unit 21 is able to forecast a time at which the voltage V of the first battery 2 is less than the first voltage corresponding to e.g. the 60% residual capacity. As shown in FIG. 4 (from time t1 to time t3), while the electric power from the second battery 23 is supplied to the electric components, the monitoring unit 21 can forecast the time at which the voltage V of the first battery 2 is less than the first value while taking into account of the residual capacity of the second battery 23. In other words, if the electric power from the second battery 23 is not supplied to the electric components, the monitoring unit 21 may forecast the time at which the voltage V of the first battery 2 is less than the first voltage based on an attenuation characteristic of the voltage V or the residual capacity of the first battery 2 as indicated by the broken line shown in FIG. 4, without taking into consideration of the residual capacity of the second battery 23.

The monitoring unit 21 can store a plurality of basic characteristics that are comparable with the attenuation characteristic of the voltage V or the residual capacity of the first battery 2. The monitoring unit 21 is able to determine or monitor whether a current attenuation characteristic corresponds to any of the plurality of stored basic characteristics. The basic characteristics correlate to dark currents of the electric components (excluding the monitoring device 20 supplied with the electric power from the second battery 23). The monitoring unit 21 can therefore forecast or monitor the dark currents of the electric components on the basis of the current attenuation characteristic or the corresponding basic characteristic. On the basis of the forecast dark currents of the electric components, a dark current (current consumption) of the monitoring device 20, and a residual capacity percentage of the second battery 23, the monitoring unit 21 can forecast or monitor a usable time (from time t1 to time t3) of the second battery 23 and, hence, can forecast or monitor a time t4 at which the voltage of the first battery 2 is less than the first voltage.

In the example shown in FIG. 2, the monitoring unit 21 can measure or monitor a current A (discharge current from the second battery 23) flowing from the second battery 23 to the regular power supply line +B or the electric components. At time t1, the monitoring unit 21 controls the switching unit 22 such that the first battery 2 and the second battery 23 are connected in parallel. In this instance, because the electric components are supplied with the electric power from the second battery 23, the discharge current from the second battery 23 can be measured. The monitoring unit 21 may forecast or monitor a usable time (from time t1 to time t3) of the second battery 23 based on the measured dark currents of the electric components (discharge current from the second battery 23), the dark current (consumption current) of the monitoring device 20), and the residual capacity percent of the second battery 23. Furthermore, the monitoring unit 21 may correct the current attenuation characteristic of the voltage V or the residual capacity of the first battery 2 while taking into consideration of the measured dark currents of the electric components (discharge current from the second battery 23).

In the example of FIG. 2, the second battery 23 has a communication terminal (gage) additional to the positive and negative terminals, and the monitoring unit 21 can measure or monitor a residual capacity percentage of the second battery 23 via the communication terminal of the second battery 23. The monitoring unit 21 is able to monitor the residual capacity percentage of the second battery 23 at any arbitrary time, such as time 0, time t1, etc. While the motor 4 is running, the monitoring unit 21 can control the switching unit 22 such that the second battery 23 is charged. In this instance, the switching unit 22 may restrict or adjust an amount of current A (charging current to the second battery 23) flowing from the regular power supply line +B to the second battery 23.

Preferably, the second battery 23 is replaceable or removable from the monitoring device 20. For instance, when a problem arises at time 0 as to the residual capacity percentage of the second battery 23, the monitoring unit 21 can inform the user of a monitoring result via the informing unit 24 by way of a notification such as, for example, "the residual capacity of the standby battery is low", "please replace the standby battery", "please charge the standby battery with a dedicated charging device".

The monitoring unit 21 is able to determine or monitor whether the current residual capacity percentage of the second battery 23 is less than a first residual capacity (for example, 10%) or not. In the example shown in FIG. 4, the residual capacity percentage of the second battery 23 is less than 10% as the first residual capacity at time t2. In the case where the monitoring device 20 serves also as a security device, the monitoring unit 21 can stop monitoring a theft of the vehicle 100 and lowers a dark current (current consumption) of the monitoring device 20.

The monitoring unit 21 can determine or monitor whether the current residual capacity percentage of the second battery 23 is less than a second residual capacity (for example, 2%) or not, where the second residual capacity being lower than the first residual capacity. In the example of FIG. 4, the residual capacity percentage of the second battery 23 at time t3 is less than 2% as the second residual capacity. After time t3, the monitoring unit 21 can control the switching unit 22 such that the first battery 2 and the second battery 23 are disconnected. As a result, reduction in the residual capacity percentage of the second battery 23 can be suppressed, and after time t3, the monitoring unit 21 operating by the electric power from the second battery 23 is able to continue monitoring of the voltage V of the first battery 21.

The monitoring unit 21 can determine or monitor whether the current voltage V of the first battery 2 is less than the first voltage. In the example of FIG. 4, the voltage V of the first battery 2 at time t4 is less than the first voltage corresponding to the 60% residual capacity. Then, the monitoring unit 21 can inform the user of a monitoring result via the informing unit 24 by way of a warning such as, for example, "the voltage of the vehicle battery is less than the first voltage", "the engine is impossible to start", or "please charge the vehicle battery". After time t4, the monitoring unit 21 can stop monitoring of the voltage V or the residual capacity of the first battery 2.

As previously described, before the thirty minutes time period from time 0 has elapsed, the monitoring unit 21 can measure or monitor the voltage V or the residual capacity of the first battery 2 at prescribed time intervals, e.g. one minute intervals. After the elapse of thirty minutes time period from the stop of the motor 4, the monitoring unit 21 can elongate the prescribed time intervals used for monitoring the voltage V or the residual capacity of the first battery 2. For example, after the thirty minute time period from time 0 has elapsed, the monitoring unit 21 may change the prescribed time intervals from one minute intervals to one hour intervals. As an alternative, after time t3, the monitoring unit 21 may measure or monitor the voltage V or the residual capacity of the first battery at five hours intervals. Thus, reduction in the residual capacity percentage of the second battery 23 can be suppressed.

Second Embodiment

The monitoring unit 21 shown in FIG. 2 monitors whether the current voltage V or the current residual capacity of the first battery 2 can start the motor 4 or not. The monitoring unit 21 may use the current voltage A or the current residual capacity of the first battery 2 to monitor whether the first battery 2 is deteriorated or not and, at the same time, the monitoring unit 21, on the basis of a monitoring result (indicative of the current voltage or residual capacity of the first battery 2), may control the switching unit 22 such that the first battery 2 and the second battery 23 are connected in parallel.

More specifically, when a voltage between the positive terminal and the negative terminal of the first battery 2 is lower than a voltage between the positive terminal and the negative terminal of the second battery 23, the monitoring unit 21 or the switching unit 22 connects the first battery 2 and the second battery 23 in parallel. By thus connecting the first and second batteries 2, 23 in parallel, the second battery 23 can supply electric power therefrom to the first battery 2.

Alternatively, on condition that the residual capacity of the first battery 2 is less than, for example, 100%, the monitoring unit 21 may control the switching unit 22 such that the first battery 2 and the second battery 23 are connected in parallel.

Furthermore, the monitoring unit 21 of FIG. 2 can determine, via the sensor 23 such as vibration sensor, whether the motor 4 is stopped or not. Thus, on the condition that the residual capacity of the first battery is less than e.g. 100% and the motor 4 is stopped, the monitoring unit 21 or the switching unit 22 may connect the first battery 2 and the second battery 23 in parallel.

As shown in FIG. 4, the voltage of the first battery 2 at time t1 is less than the second voltage corresponding to e.g. a residual capacity of 63%. On condition that the residual capacity of the first battery 2 is less than 100% and the voltage V of the first battery 2 is less than the second voltage corresponding to e.g. an 83% residual capacity, the monitoring unit 21 or the switching unit 22 may connect the first battery 2 and the second battery 23 in parallel.

After time t1 shown in FIG. 4, the first battery 2 and the second battery 23 remain connected in parallel, and the electric power from the second battery 23 is substantially supplied to the first battery 2 so that the first battery 2 is substantially charged by the second battery 23.

Figure 5:
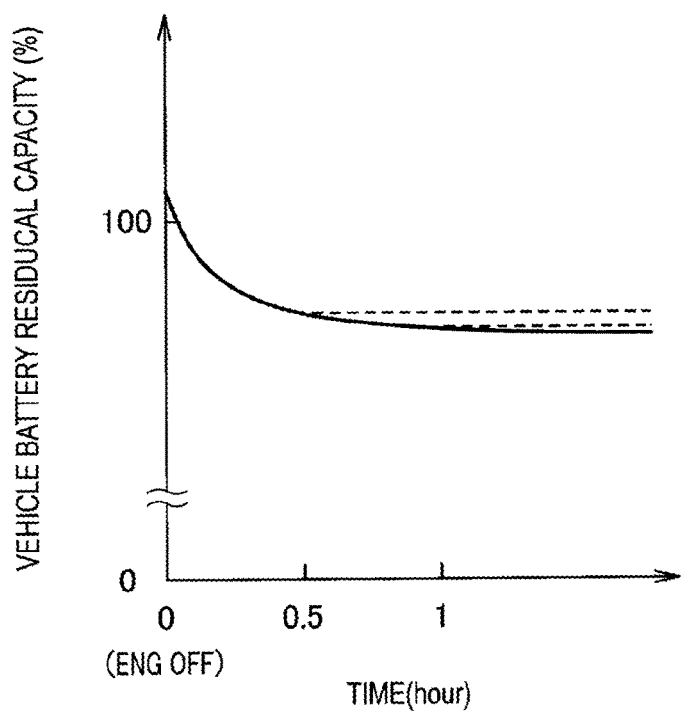
FIG. 5 is a graph showing another example of the residual capacity of the vehicle battery which changes with time.

FIG. 5 is a graph showing another example of the residual capacity of the vehicle battery which varies with time. In the example shown in FIG. 5, time 0 represents a time at which the motor 4 is stopped. The residual capacity of the vehicle battery (first battery) 2 at time 0 is more than 100%. This means that due to power generation performed by the ACG 3 before the motor 4 is stopped, the voltage of the first battery 2 measured immediately after the stop of the motor 4 represents a higher value on the effect of the ACG 3. The monitoring unit 21 shown in FIG. 2 stores the table shown in FIG. 3 and a characteristic of the first battery 2 (i.e., the relationship between the residual capacity and the voltage of the vehicle battery) represented by, for example, a numerical expression equivalent to the table of FIG. 3. On the basis of the stored battery characteristic, the monitoring unit 21 is able to convert a measured voltage V of the first battery 2 into a corresponding residual capacity of the first battery 2. After the motor 4 is stopped, the voltage V of the first battery 2 will drop as the effect of the ACG 3 on the first battery 2 decreases. Furthermore, the voltage V of the first battery 2 after the stop of the motor 4 is caused to decrease due to the effect of dark currents of the electric components. As a consequence, the voltage V or the residual capacity of the first battery decreases as indicated by the solid line shown in FIG. 5. In the example of FIG. 5, when a thirty minutes time period from time 0 has elapsed, the effect of the ACG 3 on the first battery 2 is almost eliminated. In other words, the voltage V or the residual capacity of the first battery 2 after the elapse of thirty minutes time period from time 0 is controlled by the effect of the dark currents of the electric components.

The voltage between the positive and negative terminals of the second battery 23 can be set to 12.8V which is higher than 12.5V corresponding to a 100% residual capacity of the first battery 2. The second battery 23 may be, for example, a lithium-ion storage battery. The second battery 23 is formed by a rapidly chargeable battery, which the residual capacity of the second battery 23 (with initial capacity of 2000 mAh, for example) can be charged from 0% to 100% by charging with a charge current of 2 A for e.g. one hour. The voltage of the second battery 23 constituted by the rapidly chargeable battery can be maintained at e.g. 12.8V regardless of the residual capacity of the second battery 23.

In the example of FIG. 5, when the residual capacity of the first battery 2 is less than 100%, the voltage between the positive and negative terminals of the first battery 2 is lower than the voltage between the positive and negative terminals of the secondary battery 23 and, hence, the monitoring unit 21 or the switching unit 22 may connect the first battery 2 and the second battery 23 in parallel. However, it is preferable that the first battery 2 and the second battery 23 are connected in parallel when e.g., a thirty minutes time period from time 0 has elapsed where the effect of the ACG on the first battery 2 is almost eliminated. In the case where the first battery 2 and the second battery 23 are connected in parallel when a thirty minute time period from time 0 or a one hour time period from time 0 has elapsed, the voltage V or the residual capacity of the first battery 2 can be kept at a constant value, as indicated by broken lines shown in FIG. 5.

While the motor 4 is operating, the residual capacity of the first battery 2 exceeds 100% by the effect of the ACG 3, and the voltage between the positive and negative terminals of the first battery 2 is higher than the voltage between the positive and negative terminals of the second battery 23. Thus, the monitoring unit 21 or the switching unit 22 may cut or break electric connection between the first battery 2 and the second battery 23.

FIG. 6 is a table showing an example of the relationship between the name and the output of the electric components. The headlight 11 shown in FIG. 1 has an output of e.g. 100 W and, hence, electric power consumed while the headlight 1 is on is relatively large. The vehicle 100 may include a hazard lamp, a small light, a map lamp, a door courtesy lamp, etc. as the electric components. Outputs of these electric components have respective values as shown in FIG. 6. Electricity consumption while the electric components are on is in correlation to, for example, a dark current while the motor is stopped. Accordingly, the larger the electricity consumption or the dark current, the larger the ability to lower the residual capacity of the first battery 2.

The monitoring unit 21 shown in FIG. 2 is able to monitor the current A between the regular power supply line +B and the positive terminal of the second battery 23, as previously described. While the monitoring unit 21 is monitoring the discharge current from the second battery 23, the monitoring unit 21 or the switching unit 22 may disconnect the first battery 2 and the second battery 23 on condition that the discharge current is more than a predetermined value (e.g. 5 A). When the discharge current from the second battery 23 or the dark current from the electric components is large, the monitoring unit 21 is able to perform control such that reduction of the residual capacity of the second battery 23 can be suppressed. In other words, when the discharge current from the second battery 23 is less than the predetermined value (and, preferably, while the motor 4 is off), the monitoring unit 21 controls the switching unit 22 such that the first battery 2 and the second battery 23 are connected in parallel, and the second battery 23 is allowed to supply its electric power to the first battery 2.

Third Embodiment

The monitoring device 20 or the vehicle battery monitoring system shown in FIGS. 1 and 2 may monitor an electric state on the regular power supply line +B, i.e., an electric state (for example, a voltage) of the first battery 2 and, while at the same time, the monitoring device 20 or the vehicle battery monitoring system serving as a security device may monitor whether the vehicle 100 is stolen or not.

In FIG. 1, the monitoring device 20 constituting the vehicle battery monitoring system is arranged at e.g. the node P3 on the regular power supply line +G. In this arrangement, the monitoring 20 only undergoes monitoring of the electric state on the regular power supply line +B and is not supplied with electric power from the first battery 2 via the regular power supply line +B. The monitoring device 20 is supplied with electric power from the second battery 23 shown in FIG. 2. The first battery (vehicle battery) 2 is an important component requiring for enabling startup of the motor 4, the monitoring device 20 may not only monitor the presence/absence of a theft of the vehicle 100, but also incidentally suppress reduction of the residual capacity of the first battery 2.

Figure 7:
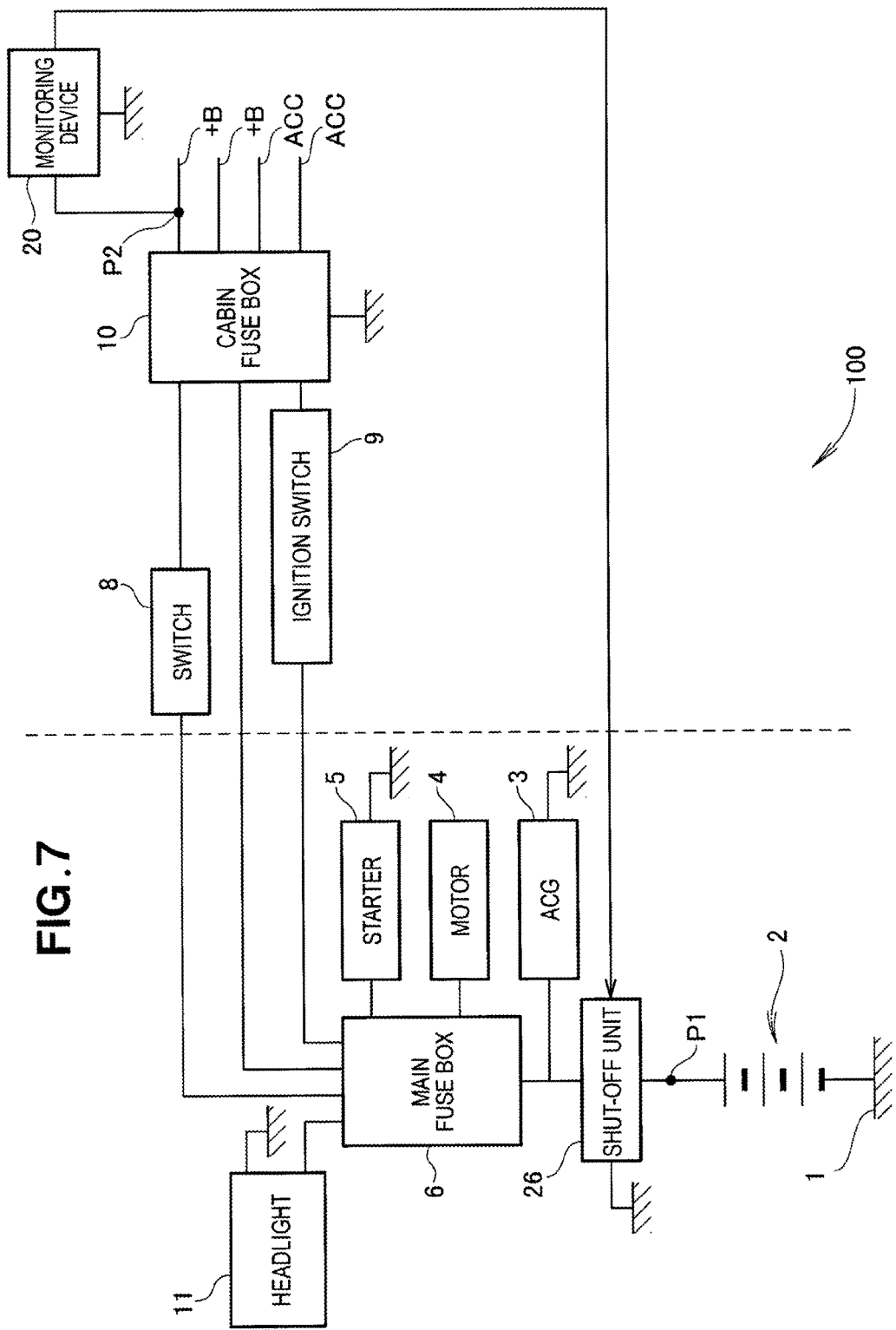
FIG. 7 is a block diagram showing a second example of configuration of a vehicle battery monitoring system according to the present invention.
Figure 8:
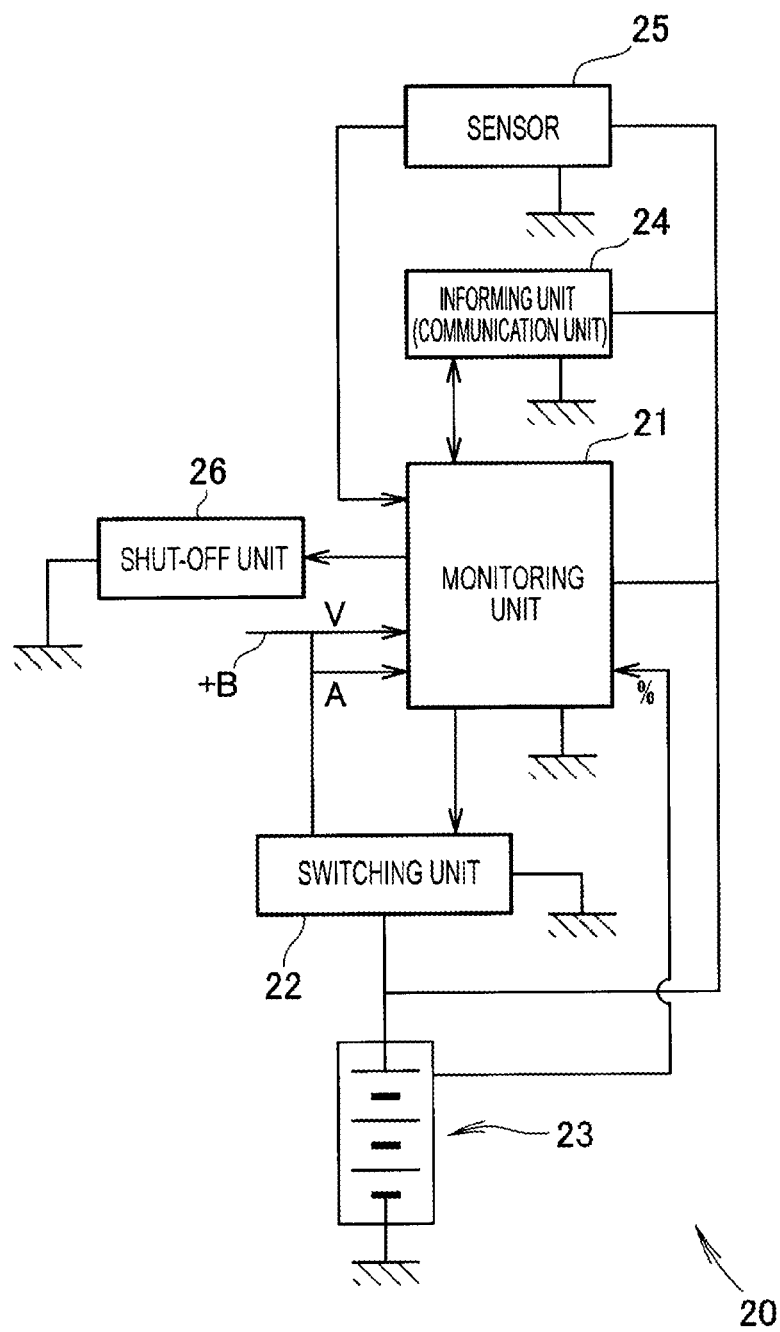
FIG. 8 is a functional block diagram of a monitoring device according to the second example of the present invention.

FIG. 7 shows a second example of configuration of the vehicle battery monitoring system according to the present invention, and FIG. 8 shows a functional block diagram of a monitoring device according to the second example of the present invention. As shown in FIGS. 7 and 8, the monitoring device 20 or the vehicle battery monitoring system further includes a shut-off unit 26 for shutting off electric power supplied from a first battery 2 to electric components. A power supply unit composed of a second battery 23 can supply electric power not only to a switching unit 22, an informing unit 24 and a vibration sensor 25, but also to the shut-off unit 26. With this arrangement, when the shut-off unit 26 is in operation, the second battery 23 can suppress reduction of the residual capacity of the first battery 2.

The monitoring device 20 may further include a movement sensor 25 for detecting movement of the vehicle 100 either in place of, or alternatively in addition to the vibration sensor 25. In other words, as for the sensor 25, the vibration sensor can solely constitute a security device, the vibration sensor and the movement sensor can be used in combination to constitute a security device, or the movement sensor can solely constitute a security device.

A monitoring unit 21 determines or monitors whether the vehicle 100 has been stolen or not based on a monitoring result (voltage V of the first battery 2). More specifically, when the voltage of the first battery 2 represents a predetermined pattern, the monitoring unit 21 can determine that the vehicle 100 has been stolen. In other words, when the vehicle 100 is stolen, an abnormality arises in the voltage of the first battery 2. The pattern indicative of the abnormality reflects various conditions described below.

Illegal use of an electric component causes power consumption of the first battery 2. When the vehicle 100 is moved illegally without operating the motor 4, the effect of the ACG 3 does not give any influence on the voltage V of the first battery 2. Furthermore, when the regular power supply line +B is cut, the voltage V of the regular power supply line +B becomes almost zero.

More specifically, while the motor 4 is off, the monitoring unit 21 monitors whether a drop rate of the voltage V of the first battery 2 is larger than a predetermined drop rate or not. When stealing the vehicle 100, a theft may illegally enter the vehicle cabin and illegally start the motor 4. In this instance, because the theft does not have a key of the vehicle, illegal startup of the motor without the key needs a certain period of time. When the theft tries to steal an electric component (part of the vehicle) such as an audio device, it will take a certain time to remove the electric component. In this instance, illegal intrusion of the theft into the vehicle cabin is accompanied with lighting of a room lamp (not shown) for a relatively long time. Under such condition, the voltage drop rate of the first battery 2 becomes large. Furthermore, when the theft cuts the regular power supply line +B, the voltage drop rate of the first battery 2 becomes large. The monitoring unit 21 can monitor the presence/absence of a vehicle theft based on the voltage drop rate of the first battery.

When the theft illegally enters the vehicle cabin, a receiver of a keyless entry system does not receive an unlock signal of a door (not shown). In other words, illegal entering of the theft is accompanied with lighting of the room lamp caused due to opening of the door under the condition that a direction indicator lamp (not shown) is not flickering. Lighting of the room lamp will increase the voltage drop rate of the first battery 2. It is, therefore, preferable that the monitoring unit 21 determines or monitors whether the direction indicator lamp is in an OFF state. When the direction indicator lamp is flickering, a waveform of the voltage V of the first battery 2 includes a ripple. It is desirable that the monitoring unit 21 monitors whether the voltage drop rate of the first battery 21 is larger than the predetermined voltage drop rate or not, and whether a ripple is generated in the waveform of the voltage of the first battery 2 or not. The monitoring unit 21 can inform the user of a theft of the vehicle 100, as a monitoring result, via the informing unit 24 by way of a notification such as "a door is opened by a theft" or "please check the car".

As an alternative, while the vehicle 100 is moving, the monitoring unit 21 may monitor whether a variation width of the voltage V of the first battery 2 during a prescribed period is smaller than a predetermined variation width or not. When or after stealing the vehicle 100, the theft may pull or tow the vehicle 100 by a wrecker truck (not shown) without starting the motor 4. In this instance, because the motor 4 is not operating, the ACG 3 does not generate electric power. Under such condition, the voltage variation width of the first battery 2 is not increased. On the other hand, when the ACG 3 undergoes power generation, the voltage variation width of the first battery becomes large such that the voltage V of the first battery 2 fluctuates slightly and quickly. The monitoring unit 21 can monitor the presence/absence of a vehicle theft based on the voltage variation width of the first battery 2.

Figure 9:
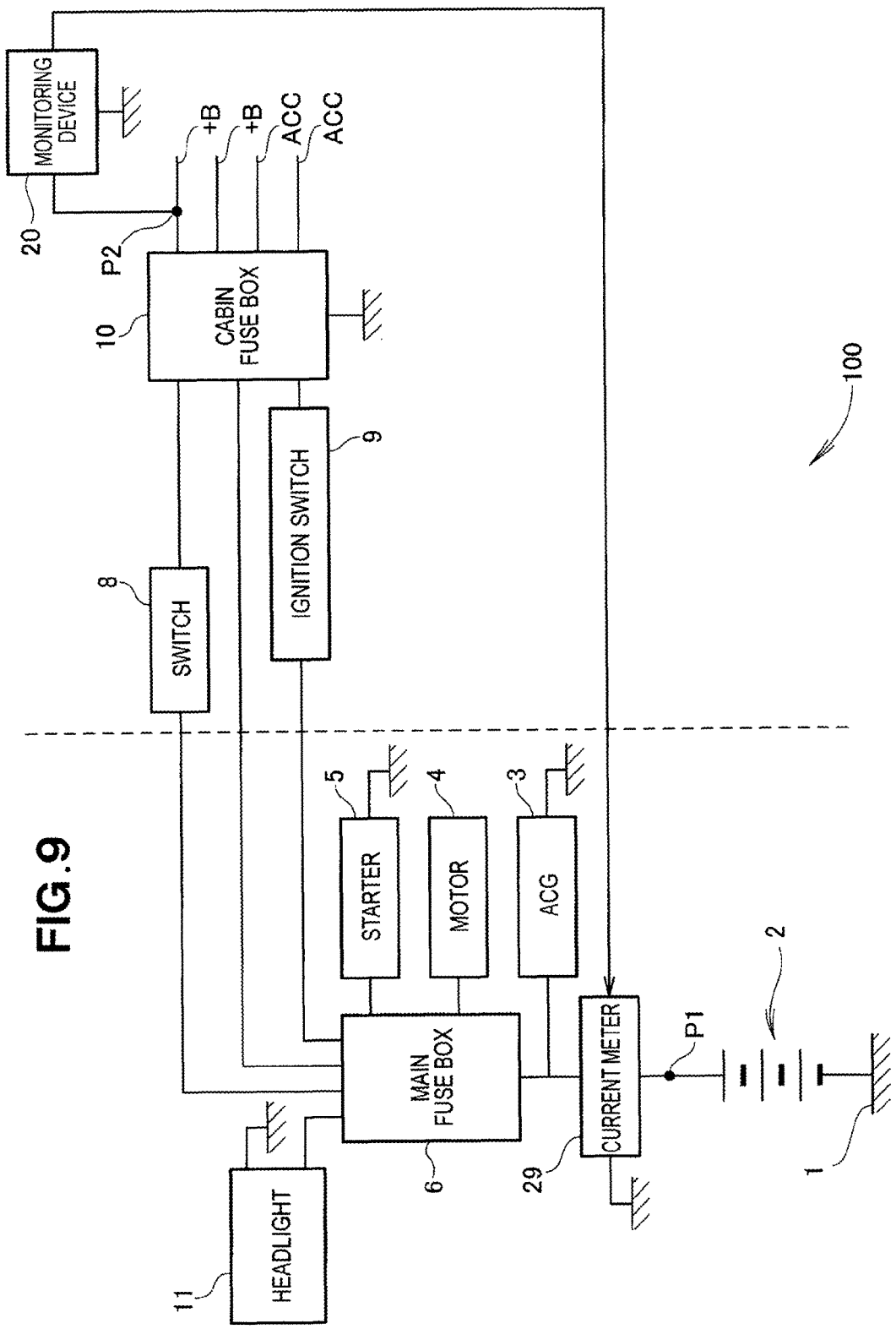
FIG. 9 is a block diagram showing a third example of configuration of a vehicle battery monitoring system according to the present invention.

FIG. 9 shows a still another example of configuration of the vehicle battery monitoring system according to the present invention. As shown in FIG. 9, the vehicle battery monitoring system further includes a current meter 29 in place of the shut-off unit 26 shown in FIG. 7. The current meter 29 shown in FIG. 9 is disposed between the positive terminal of a first battery 2 and a main fuse box 6 and, hence, is able to detect a current of the first battery 2. The vehicle battery monitoring system of FIG. 9 may be provided with the current meter 29 and the shut-off unit 26 of FIG. 7.

Figure 10:
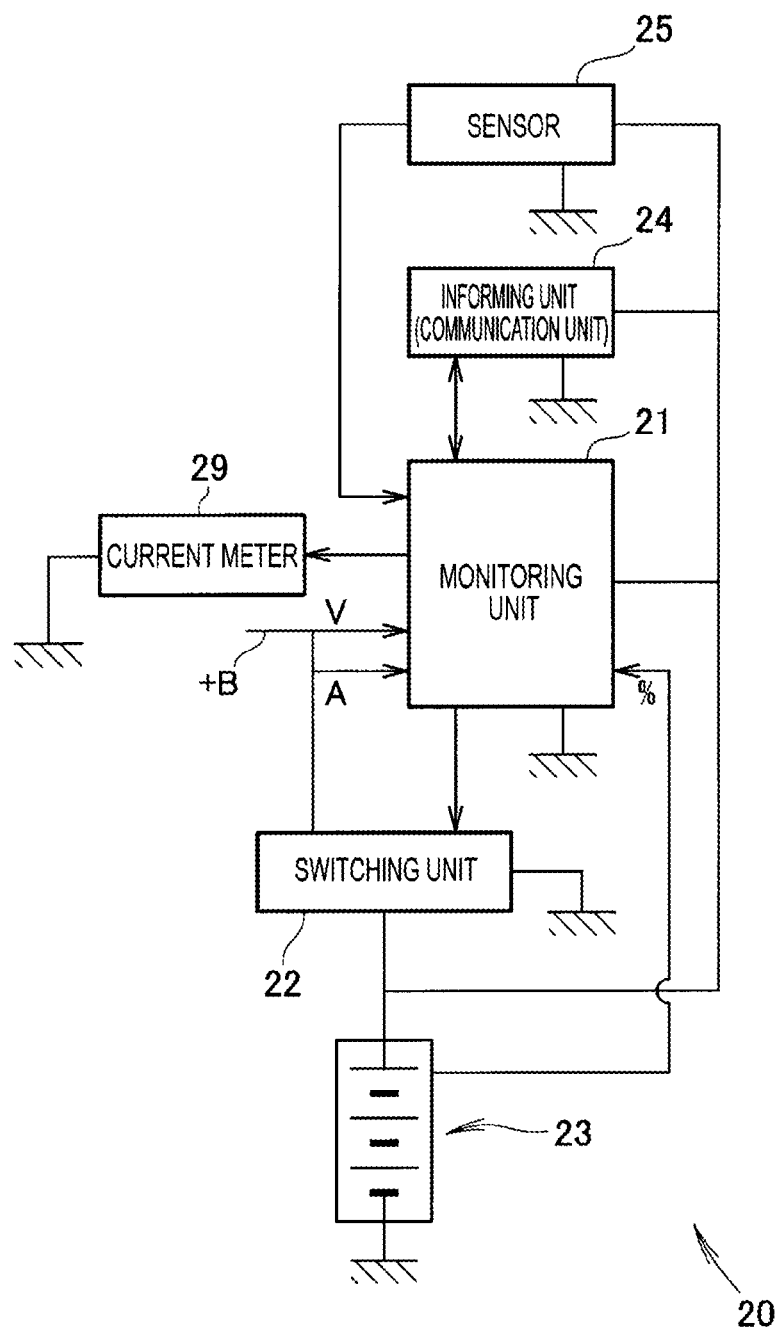
FIG. 10 is a functional block diagram of a monitoring device according to the third example of the present invention.

FIG. 10 shows a functional block diagram of a monitoring device according to the example shown in FIG. 9. As shown in FIG. 10, the monitoring device 20 constituting the vehicle battery monitoring system includes the current meter 29 and a monitoring unit 21, which monitors an electric state (current) of the base of the positive terminal of the first battery 2, namely, an electric state (current) of the first battery 2 by using the current meter 29. An electric power supply formed by a second battery 23 can supply electric power to the current meter 29.

The monitoring unit 21 shown in FIG. 10 monitors a current A of the first battery 2 (at, for example, the base of the positive terminal of the first battery 2) as the electric state of the first battery 2. Desirably, the monitoring unit 21 can monitor not only the current A of the first battery 2, but also the voltage V of the first battery 2 as described above.

The monitoring unit 21 of FIG. 10 determines or monitors whether the vehicle 10 has been stolen or not based on the current A of the first battery 2 (preferably, and the voltage V of the first battery 2) as a monitoring result of the monitoring unit 21. More specifically, when the current A of the first battery 2 exhibits a prescribed pattern, the monitoring unit 21 can determine that the vehicle 100 has been stolen. In other words, when the vehicle 100 is stolen, an abnormality occurs in the current of the first battery 2. The pattern indicative of the abnormality reflects various conditions discussed below.

Illegal use of an electric component causes power consumption of the first battery 2. Furthermore, when the vehicle 100 is moved illegally without operating the motor 4, the effect of the ACG 3 does not give any influence on the current A of the first battery 2.

More specifically, while the motor 4 is off, the monitoring unit 21 monitors whether an increase rate of the current A of the first battery 2 is larger than a predetermined increase rate or not. When stealing the vehicle 100, a theft may illegally enter the vehicle cabin and illegally start the motor 4. In this instance, illegal intrusion of the theft into the vehicle cabin is accompanied with lighting of a room lamp (not shown) for a relatively long time. Under such condition, a current consumption rate of the first battery 2 (represented by an increase rate of an integral value of the discharge current of the first battery 2) becomes large.

When the theft illegally enters the vehicle cabin, a receiver of a keyless entry system does not receive an unlock signal of a door (not shown). In other words, illegal entering of the theft is accompanied by lighting of the room lamp caused due to opening of the door without accompanied by flickering of a direction indicator lamp (not shown). Lighting of the room lamp will increase the current consumption rate of the first battery 2. It is, therefore, preferable that the monitoring unit 21 determines or monitors whether the direction indicator lamp is in an OFF state. When the direction indicator lamp is flickering, a waveform of the current A of the first battery 2 involves a ripple. It is, therefore, desirable that the monitoring unit 21 monitors whether the current consumption rate of the first battery 21 is larger than a predetermined current consumption rate or not, and whether a ripple is generated in the waveform of the current A of the first battery 2 or not. The responsivity of the current A of the first battery 2 is higher than the responsivity of the voltage V of the first battery 2. The monitoring unit 21 using the current meter 29 is, therefore, able to easily determine or monitor that the direction indicator lamp is not flickering. The monitoring unit 21 that monitors both the current A and the voltage V of the first battery 2 can determine or monitor with increased reliability that the direction indicator lamp is not flickering.

As an alternative, while the vehicle 100 is moving, the monitoring unit 21 shown in FIG. 10 may monitor whether a charge amount of the current A of the first battery 2 during a prescribed period is smaller than a predetermined charge amount or not. The monitoring unit 21 of FIG. 10 may further monitor whether a variation width of the voltage V of the first battery 2 during the prescribed period is smaller than a prescribed variation width. When or after stealing the vehicle 100, the theft may pull or tow the vehicle 100 by a wrecker truck (not shown) without starting the motor 4. In this instance, because the motor 4 is not operating, the ACG 3 does not generate electric power. Under such condition, the current charge amount of the first battery 2 (i.e., a charge current of the first battery 2) does not increase. In other words, when the discharge current of the first battery 2 has a positive value, the charge current of the first battery 2 has a negative value; and when the ACG 3 does not undergo power generation, the current A (charge current) of the first battery 2 does not show a negative value. Alternatively when the ACG 3 undergoes power generation, the first battery 2 is charged with electric power from the ACG 3 and the charge current of the first battery 2 shows a negative value. The monitoring unit 21 can monitor the presence/absence of a vehicle theft based on the charge amount of the current A of the first battery 2.

The vehicle 100 is used illegally when subjected to stealing. Under such condition, the monitoring unit 21 shown in FIG. 8 may cause the first battery 2 to be discharged. By thus discharging the first battery 2, the voltage V of the first battery 2 is caused to drop and the residual capacity of the first battery 2 becomes lower than 60%. Under such condition, the first battery 2 does not have enough power to start-up the motor 4. By thus disabling the motor 4, it is possible to prevent a theft of the vehicle 100 itself. Similarly, when the vehicle 100 is stolen, the shut-off unit 26 may shut off electric power supplied from the first battery 2 to the electric components, thereby disabling the motor 4.

The monitoring units 21 shown in FIGS. 8 and 10, have a load (now shown) used exclusively for the purpose of discharging electric power from the first battery 2 and they are able to apply the voltage of the first battery 2 to the load. As an alternative, the monitoring units 21 may control the respective switching units 22 such that the regular power supply line +B is connected to the ground (vehicle body 1). In this instance, it is preferable that the monitoring units 21 monitor the currents flowing through the respective switching units 22 and, under the control of the monitoring units 21, the respective switching units 22 restrict or adjust the current A (charge current of the second battery 23) flowing from the regular power supply line +B to the ground (vehicle body 1) to not more than 2 A.

The shut-off unit 26 shown in FIG. 7 is disposed between the positive terminal of the first battery 2 and the main fuse box 6 and, under the control of the monitoring unit 21, the shut-off unit 26 is able to float the positive terminal of the first battery 2. As an alternative, the shut-off unit 26 may be constituted by a relay and, under the control of the monitoring unit 21, the shut-off unit 26 cuts or breaks the electric connection between the positive terminal of the first battery 2 and the main fuse box 6. The shut-off unit 26 can disable all of the electric components which are operable by electric power from first battery 2. The shut-off unit 26 may alternatively disable at least the starter 5 and, in this instance, the shut-off unit 26 is arranged at an arbitrary position between the positive terminal of the first battery 2 and the starter 5. For example, the shut-off unit 26 is disposed in the main fuse box 6.

The monitoring device 20 can continue monitoring of the presence/absence of a theft of the vehicle 100 until the residual capacity of the second battery 23 is lost. The monitoring unit 21 shown in FIG. 8 can inform the user of a currently measured voltage V (or a residual capacity resulting therefrom) of the first battery 2 and/or a theft of the vehicle 100, as a monitoring result, via the informing unit 24. The informing unit 24 is formed by, for example, a display, a speaker, etc. and, hence, is able to inform the user (passenger) inside the vehicle cabin of the monitoring result. Preferably, the informing unit 24 is constituted by a transmitter such as a 3G communication module, a long term evolution (LTE) communication module, a wireless fidelity (Wi-Fi) communication module, etc., so that the monitoring result (e.g. a theft of the vehicle 100 and a currently measured voltage V or a currently measured residual capacity of the first battery 2) can be transmitted in a proper transport format such as e-mail to the user or a mobile terminal (not shown) inside or outside the cabin. In response to the transmitted monitoring result, the user is allowed to visually conform whether the vehicle 100 is stolen or not. When the residual capacity of the first battery 2 is monitored incidentally, the user can recover the residual capacity of the first battery 2 by, for example, driving the vehicle 100, charging the first battery 2 with a dedicated charging device (not shown), or connecting a booster cable (not shown) to the first battery 2, before the voltage V or the residual capacity of the battery becomes small. Alternatively, the user may use the first battery 2 or the electric components without taking case of the residual capacity of the first battery 2 until the voltage V or the residual capacity of the first battery 2 becomes small. Alternatively, when the residual capacity of the first battery 2 is monitored incidentally, the user may use the first battery or the electric components without taking care of the residual capacity of the first battery 2 until the residual capacity of the first battery becomes small.

The sensors shown in FIGS. 8 and 10 may be constituted by a triaxial acceleration sensor, as described above. The triaxial acceleration sensor can detect movement of the vehicle 100, so that the monitoring unit 21 can determine, via the triaxial acceleration sensor, whether the vehicle 100 is moving or not. Movement of the vehicle 10 can be also detected by a global positioning system (GPS) sensor. Thus, the monitoring unit 21 can determine or monitor the presence/absence of the movement of the vehicle 100 by using the sensor 25 such as the acceleration sensor, GPS sensor, etc.

As discussed above, while the vehicle 100 is off, the monitoring unit 21 may rely on the detection of only a low frequency vibration by the vibration sensor in making a determination or monitoring whether the vehicle 100 has been stolen or not. However, when for example, a cat has jumps up on the engine hood (not shown) and produces vibration, it may occur that a theft of the vehicle 100 is erroneously determined even when the situation is not a vehicle theft actually. It is, therefore, preferable that the monitoring unit 21 determines whether the vehicle 100 has been stolen or not based on a result of monitoring the voltage V of the first battery 2 (preferably, and the current A of the first battery 2). Desirably, the monitoring unit 21 determines whether the vehicle 100 has been stolen or not based on both a monitoring result by the vibration sensor about the low frequency vibration, and a monitoring result concerning the voltage V of the first battery 2.

As shown in FIG. 4, the monitoring unit 21 can measure or monitor the voltage V or the residual capacity of the first battery 2 and store the measured values at prescribed time intervals, for example, one minute intervals until the effect of the ACG 3 on the first battery 2 is almost eliminated, namely until a thirty minutes time period from time 0 has elapsed. When monitoring the presence/absence of a theft of the vehicle 100 based on the voltage drop rate of the first battery, the monitoring unit 21 may determine the presence/absence of a vehicle theft after the elapse of a thirty minutes time period from time 0 where the effect of the ACG 3 on the first battery 2 is almost eliminated.

Before the elapse of a thirty minutes time period from time 0, if the monitoring unit 21 is not engaged in monitoring of the presence/absence of a vehicle theft based on the voltage drop rate of the first battery 2, the monitoring unit 21 may undertake forecasting or monitoring of switching-off oversight of an electric component such as the headlight 11, etc. More specifically, for a thirty minutes time period from time 0, if a current attenuation characteristic is larger than the past attenuation characteristic and a reduction rate of the voltage or residual capacity of the first battery is large, the monitoring unit 21 can inform the user of a corresponding monitoring result via the informing unit 24 by way of a notification such as, for example, "the headlight is still lighting, please return to the vehicle", or "do you forget to turn off any electric component?".

In the case where the monitoring unit 21 monitors the presence/absence of a theft of the vehicle 100 based on the voltage drop rate of the first battery 2, during a period from time t1 to time t3, the switching unit 21 does not connect the first battery 2 and the second battery 23 in parallel at time t1. In this case, as indicated by the broken line shown in FIG. 4, after time t1, the voltage V or the residual capacity of the first battery 2 is lowered by dark currents of the electric components. The monitoring unit 21 may determine a drop rate of the voltage V of the first battery 2 upon elapse of a thirty minute period from time 0 and, when a current voltage V of the first battery 2 is lower than a voltage estimated by the determined voltage drop rate, the monitoring unit 21 determines that the voltage drop rate of the first battery 2 is larger than a predetermined drop rate. Similarly, the monitoring unit 21 can determine that the current consumption rate of the first battery 2 is larger than a predetermined consumption rate. However, even when the monitoring unit 21 is monitoring the presence/absence of a vehicle theft based on the voltage drop rate of the first battery 2 and/or the current consumption rate of the first battery 2, for a time period from time t1 to time t3, the switching unit 22 may connect the first battery 2 and the second battery 23 in parallel at time t1 unless the monitoring unit 21 detects a low frequency vibration by means of the vibration sensor.

As shown in FIG. 4, the residual capacity percentage of the second battery 23 at time t2 is less than a first residual capacity, for example, 10%. The monitoring unit 21 can inform the user of a condition of the standby battery, as a monitoring result, via the informing unit 24 by way of a notification such as, for example, "the residual capacity of the standby battery is less than 10%". The user is allowed to give a higher priority to the monitoring of the first battery than to the monitoring of a theft of the vehicle 100. In this instance, the user or a mobile terminal sends a vehicle theft monitoring stop instruction to the communication unit forming an informing unit 24, and the monitoring unit 21 stops function or control to monitor the presence/absence of a vehicle theft, thereby reducing electricity consumption of the monitoring unit 21 or the monitoring device 20. When the monitoring unit 21 stops function or control to monitor the presence/absence of a vehicle theft, the informing unit 24 can inform the user of a monitoring condition of the monitoring unit 21 via the informing unit 24 by way of a notification such as, for example, "vehicle theft monitoring is stopped".

The function or control to monitor the presence/absence of a vehicle theft by the monitoring unit 21 may be stopped at time t3 or time t4.

As previously discussed, during a time period before the elapse of thirty minutes from time 0, the monitoring unit 21 may measure or monitor the voltage or the residual capacity of the first battery 2 at prescribed time intervals such as one minute intervals. After the elapse of the thirty minutes period from the stop of the motor 4, the monitoring unit 21 may shorten the prescribed time intervals from e.g. one minute intervals to e.g. one second intervals. However, unless the monitoring unit 21 detects a low frequency vibration by means of the vibration sensor, after the elapse of a thirty minutes period from time 0, the monitoring unit 21 may elongate the prescribed time intervals used for monitoring the voltage V or the residual capacity of the first battery 2. For example, after the elapse of a thirty minutes period from time 0, the monitoring unit 21 may change the prescribed time intervals from e.g. one minute intervals to e.g. one hour intervals unless the monitoring unit 21 detects a low frequency vibration via the vibration sensor. Furthermore, after time t3, the monitoring unit 21 may measure or monitor the voltage or the residual capacity of the first battery 2 at five hours intervals unless the monitoring unit 21 detects a low frequency vibration via the vibration sensor. Thus, reduction in the residual capacity percentage of the second battery 23 can be suppressed.

The present invention should by no means be limited to the embodiments described above. It is therefore obvious to those skilled in the art that the foregoing embodiments can be changed or modified without departing from the scope of the appended claims.

REFERENCE SIGNS LIST

1 . . . vehicle body, 2 . . . first battery (vehicle battery), 3 . . . ACG, 4 . . . motor, 5 . . . starter, 6 . . . main fuse box, 8 . . . switch, 9 . . . ignition switch, 10 . . . cabin fuse box, 11 . . . headlight (electric component), 20 . . . monitoring device (vehicle battery monitoring system), 21 . . . monitoring unit, 23 . . . switching unit, 23 . . . second battery (standby battery), 24 . . . informing unit, 25 . . . sensor, 26 . . . shut-off unit, 29 . . . current meter, 100 . . . vehicle, ACC . . . accessory power supply line, +B . . . regular power supply line

The invention claimed is:

1. A system for monitoring a first battery provided in a vehicle, comprising:

a monitoring unit for monitoring an electric state of the first battery capable of starting a motor of the vehicle;

a power supply unit that is a second battery for supplying electric power to the monitoring unit; and a switching unit capable of connecting the first battery and the second battery in parallel, wherein the monitoring unit determines whether the motor is stopped or not, and when the motor is stopped, the monitoring unit monitors a voltage of the first battery as the electric state, wherein the monitoring unit forecasts a time when the voltage of the first battery is less than a first voltage based on an attenuation characteristic of the voltage of the first battery, wherein when the motor is stopped, the monitoring unit controls the switching unit such that the first battery and the second battery are connected in parallel, and the second battery supplies the electric power therefrom to an electric component to which electric power from the first battery has been supplied, wherein the monitoring unit controls the switching unit such that the first battery and the second battery are disconnected during a time period ranging from when the motor is stopped to when the voltage of the first battery is less than a second voltage higher than the first voltage, wherein the monitoring unit monitors a discharge current flowing from the second battery to the electric component, and wherein the monitoring unit corrects a current attenuation characteristic of the voltage of the first battery based on the monitored discharge current, the current of the monitoring device, and a residual capacity percent of the second battery.

2. The system as defined in claim 1, further comprising:
a vibration sensor for detecting vibration of the motor,
wherein the monitoring unit determines with the vibration sensor whether the motor is stopped or not.

3. The system as defined in claim 1, further comprising:
wherein the monitoring unit, on the basis of a monitoring result, controls the switching unit such that the first battery and the second battery are connected in parallel, and the second battery supplies the electric power therefrom to the first battery.

4. The system as defined in claim 3, wherein when the discharge current is less than a predetermined value, the monitoring unit controls the switching unit such the first battery and the second battery are connected in parallel, and the second battery supplies the electric power therefrom to the first battery.

5. The system as defined in claim 3, wherein when the discharge voltage is less than a predetermined voltage and the motor is stopped, the monitoring unit controls the switching unit such that the first battery and the second battery are connected in parallel, and the second battery supplies the electric power therefrom to the first battery.

6. The system as defined in claim 3, wherein when the motor is in operation, the monitoring unit charges the second battery.

7. The system as defined in claim 1, wherein the monitoring unit, on the basis of a monitoring result, determines whether the vehicle is stolen or not.

8. The system as defined in claim 7, wherein when the motor is stopped, the monitoring unit monitors whether a voltage drop rate, as the electric state, of the first battery is larger than a predetermined drop rate or not, and/or whether a current consumption rate, as the electric state, of the first battery is larger than a predetermined consumption rate.

9. The system as defined in claim 7, wherein when the vehicle is moving, the monitoring unit monitors whether a variation width of the voltage, as the electric state, of the first battery during a prescribed period is smaller than a predetermined variation width or not, and/or whether a charge amount, as the electric state, of the first battery during a prescribed period is smaller than a predetermined charge amount.

10. The system as defined claim 7, wherein when the vehicle is stolen, the monitoring unit causes the first battery to be discharged.

11. The system as defined claim 7, further comprising:
a shut-off unit for shutting off electric power supplied from the first battery to an electric component.

12. The system as defined claim 1, further comprising:
an informing unit for informing a user of a monitoring result of the monitoring unit.

* * * * *